United States Patent
Newman et al.

(10) Patent No.: US 9,281,428 B2
(45) Date of Patent: *Mar. 8, 2016

(54) MOUNTING SYSTEM FOR PHOTOVOLTAIC PANELS

(71) Applicant: Energy Laboratories, Inc., Jacksonville, FL (US)

(72) Inventors: Michael Newman, Jacksonville, FL (US); Glen Newman, Jacksonville, FL (US)

(73) Assignee: Energy Laboratories, Inc., Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/285,033

(22) Filed: May 22, 2014

(65) Prior Publication Data

US 2014/0338729 A1 Nov. 20, 2014

Related U.S. Application Data

(63) Continuation of application No. 13/448,918, filed on Apr. 17, 2012, now Pat. No. 8,763,978, which is a continuation of application No. 12/404,546, filed on Mar. 16, 2009, now abandoned.

(60) Provisional application No. 61/037,092, filed on Mar. 17, 2008.

(51) Int. Cl.
| | |
|---|---|
| A47B 97/00 | (2006.01) |
| H01L 31/042 | (2014.01) |
| F24J 2/52 | (2006.01) |
| F24J 2/46 | (2006.01) |
| F24J 2/54 | (2006.01) |

(52) U.S. Cl.
CPC ........... *H01L 31/0422* (2013.01); *F24J 2/5205* (2013.01); *F24J 2/5211* (2013.01); *F24J 2/5245* (2013.01); *F24J 2/5254* (2013.01); *F24J 2/5258* (2013.01); *F24J 2/5264* (2013.01); *H02S 20/00* (2013.01); *F24J 2002/4658* (2013.01); *F24J 2002/529* (2013.01); *F24J 2002/5486* (2013.01); *Y02B 10/12* (2013.01); *Y02E 10/47* (2013.01); *Y02E 10/50* (2013.01)

(58) Field of Classification Search
CPC ....... F24J 2/5205; F24J 2/5211; F24J 2/5245; F24J 2/5254; H01L 31/0422; Y02B 10/122; Y02E 10/50

See application file for complete search history.

(56) References Cited

U.S. PATENT DOCUMENTS

| | | |
|---|---|---|
| 4,692,557 A | 9/1987 | Samuelson et al. |
| 4,826,122 A | 5/1989 | Cupp |
| 5,164,020 A | 11/1992 | Wagner et al. |
| 5,571,338 A | 11/1996 | Kadonome et al. |
| 6,201,180 B1 | 3/2001 | Meyer et al. |

(Continued)

*Primary Examiner* — Amy Sterling
(74) *Attorney, Agent, or Firm* — Smith Gambrell & Russell LLP

(57) ABSTRACT

A mounting system for mounting photovoltaic panels on a support structure. The mounting system comprises photovoltaic panel frames in which the photovoltaic panels are mounted, panel support rails, and mounting brackets or cross beams for supporting the panel support rails. The panel frames have inwardly extending panel frame extensions on their back side. The panel support rails are mounted on the support structure with either pivoting brackets or cross beams. In either case, the support rails have pairs of stationary clamps and movable clamps with clamp lips that engage the panel frame extensions of the panel frames.

5 Claims, 13 Drawing Sheets

(56) References Cited

U.S. PATENT DOCUMENTS

| | | |
|---|---|---|
| 6,254,397 B1 | 7/2001 | Elmer |
| 6,269,596 B1 | 8/2001 | Ohtsuka et al. |
| 6,672,018 B2 | 1/2004 | Shingleton |
| 7,100,338 B2 | 9/2006 | Haddock |
| 7,600,349 B2 | 10/2009 | Liebendorfer |
| 7,774,998 B2 * | 8/2010 | Aschenbrenner ............ 52/173.3 |
| 8,256,170 B2 | 9/2012 | Plaisted |
| 2003/0015636 A1 | 1/2003 | Liebendorfer |
| 2003/0101662 A1 | 6/2003 | Ullmann |
| 2007/0295391 A1 | 12/2007 | Lenox et al. |
| 2008/0169018 A1 | 7/2008 | Miyamoto et al. |
| 2009/0165843 A1 | 7/2009 | Horioka et al. |
| 2010/0119324 A1 | 5/2010 | Townson et al. |
| 2010/0276558 A1 | 11/2010 | Faust et al. |
| 2011/0210085 A1 | 9/2011 | Plaisted |
| 2011/0284708 A1 | 11/2011 | McPheeters |

* cited by examiner

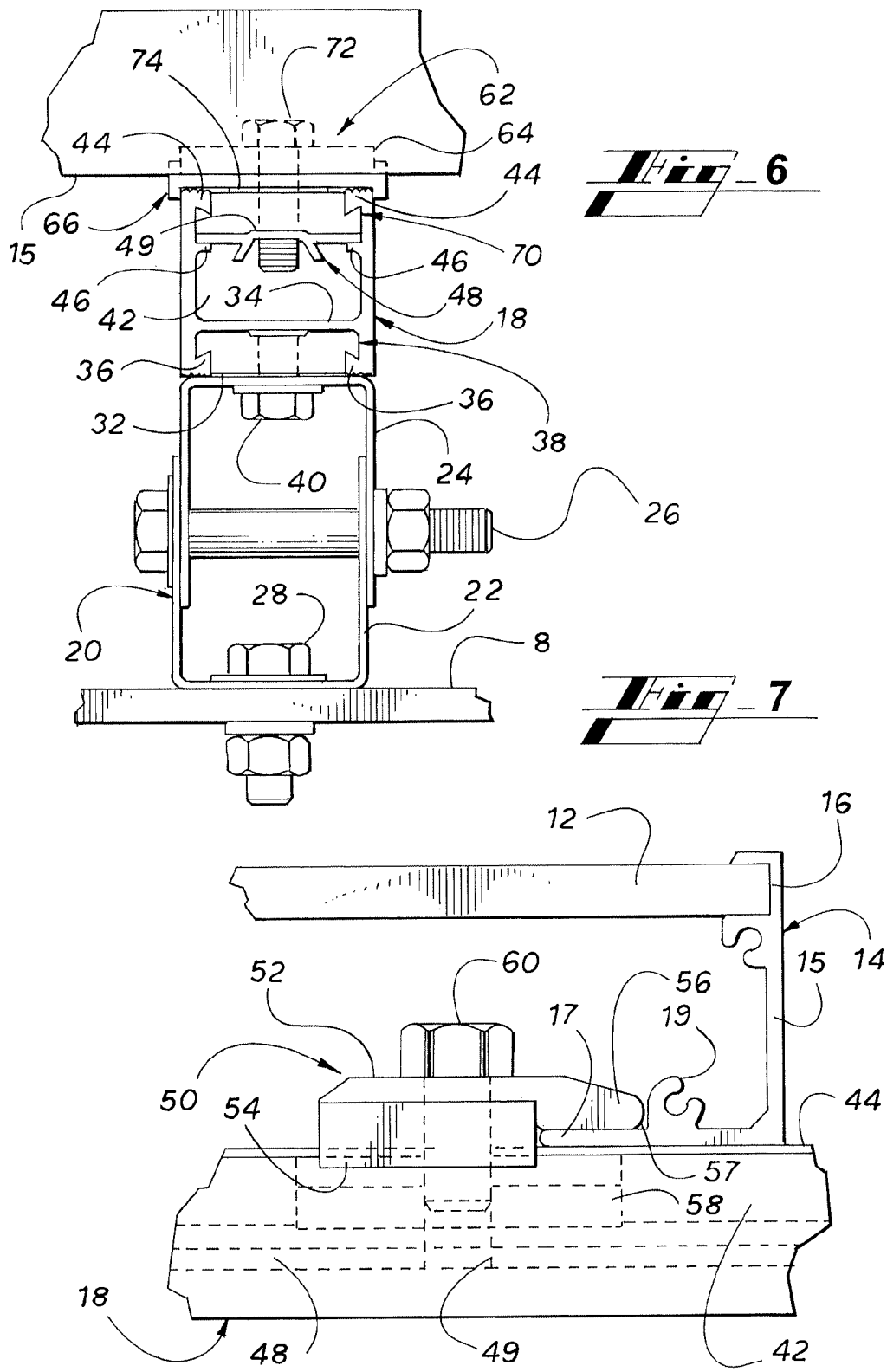

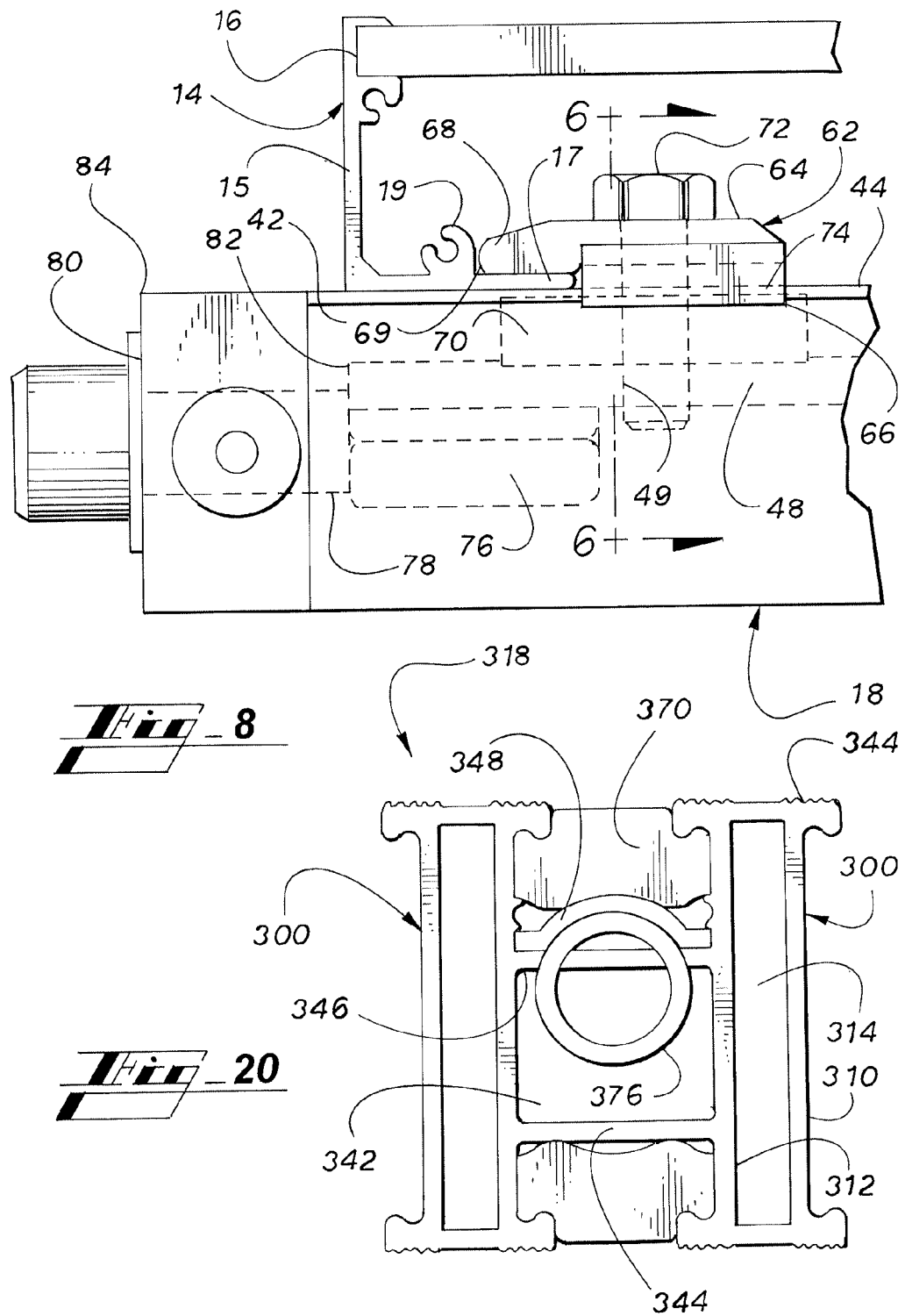

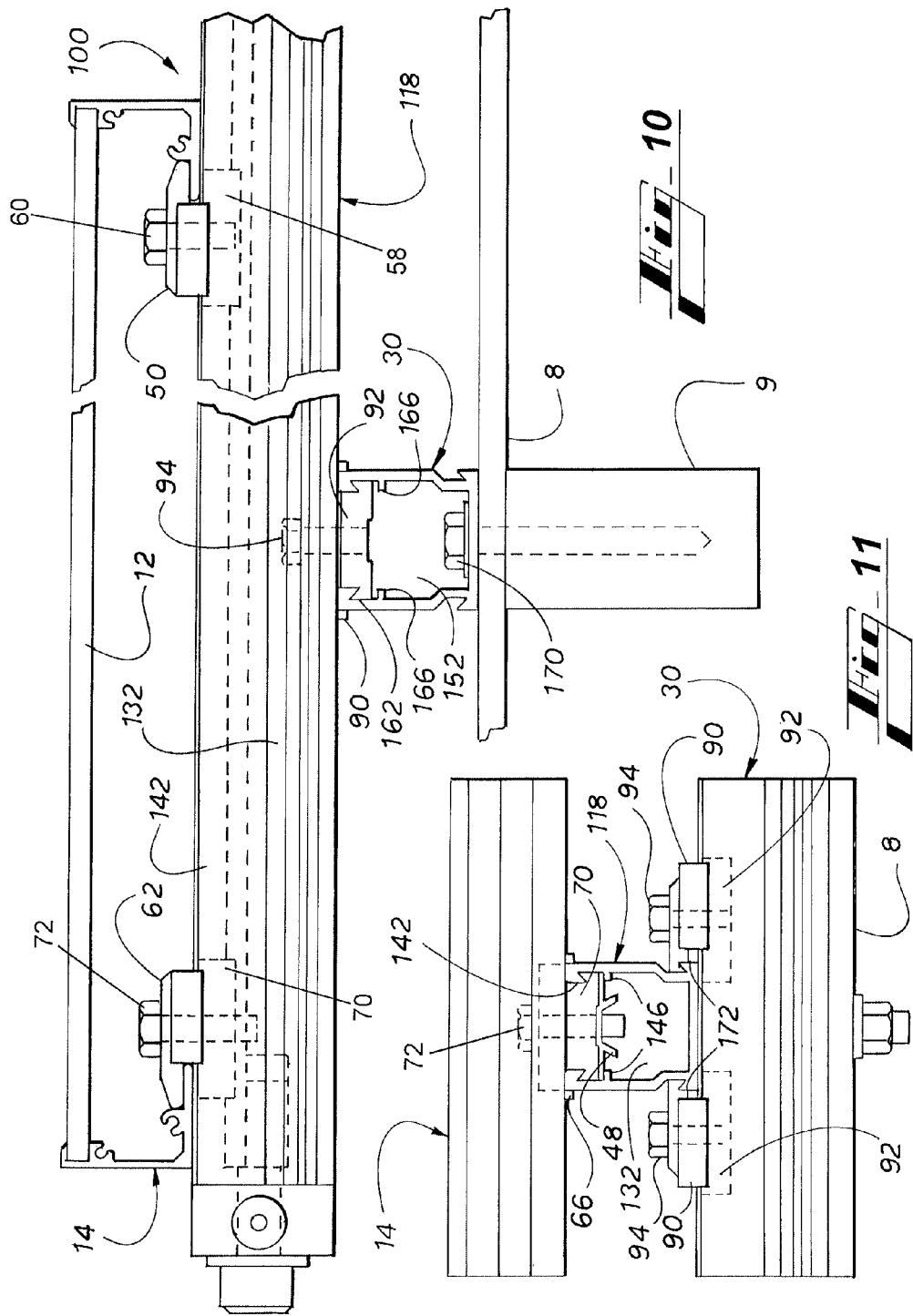

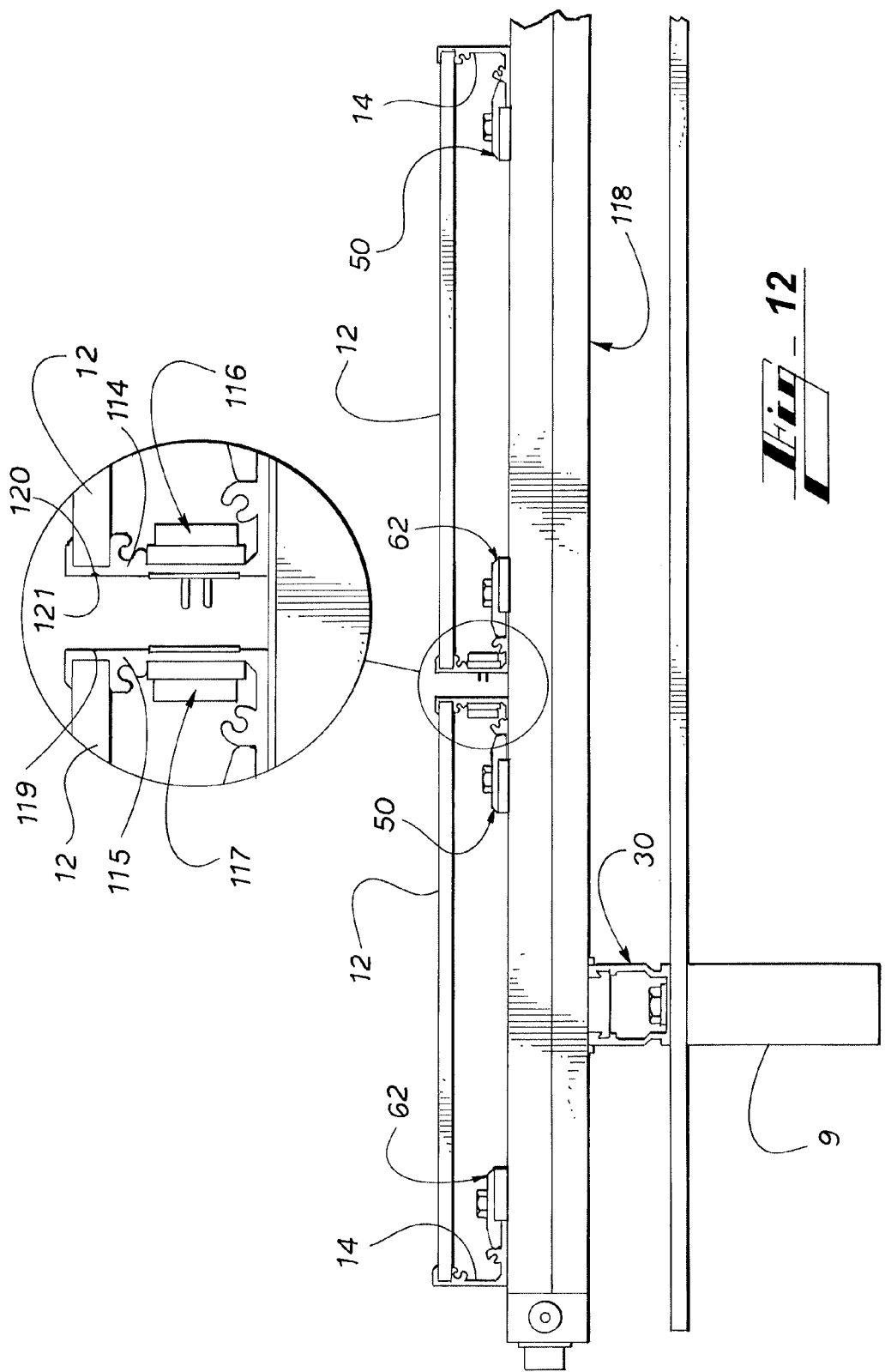

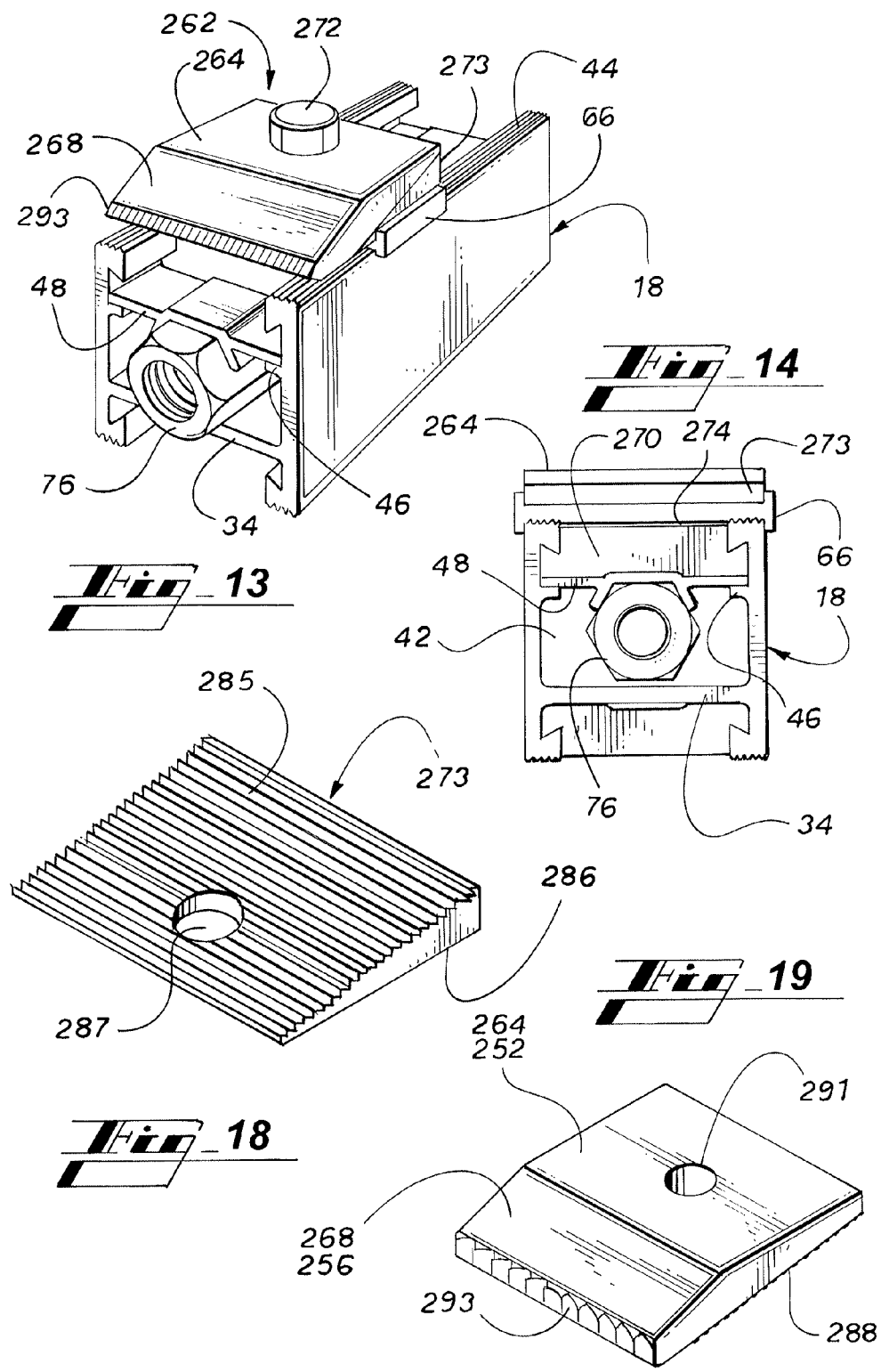

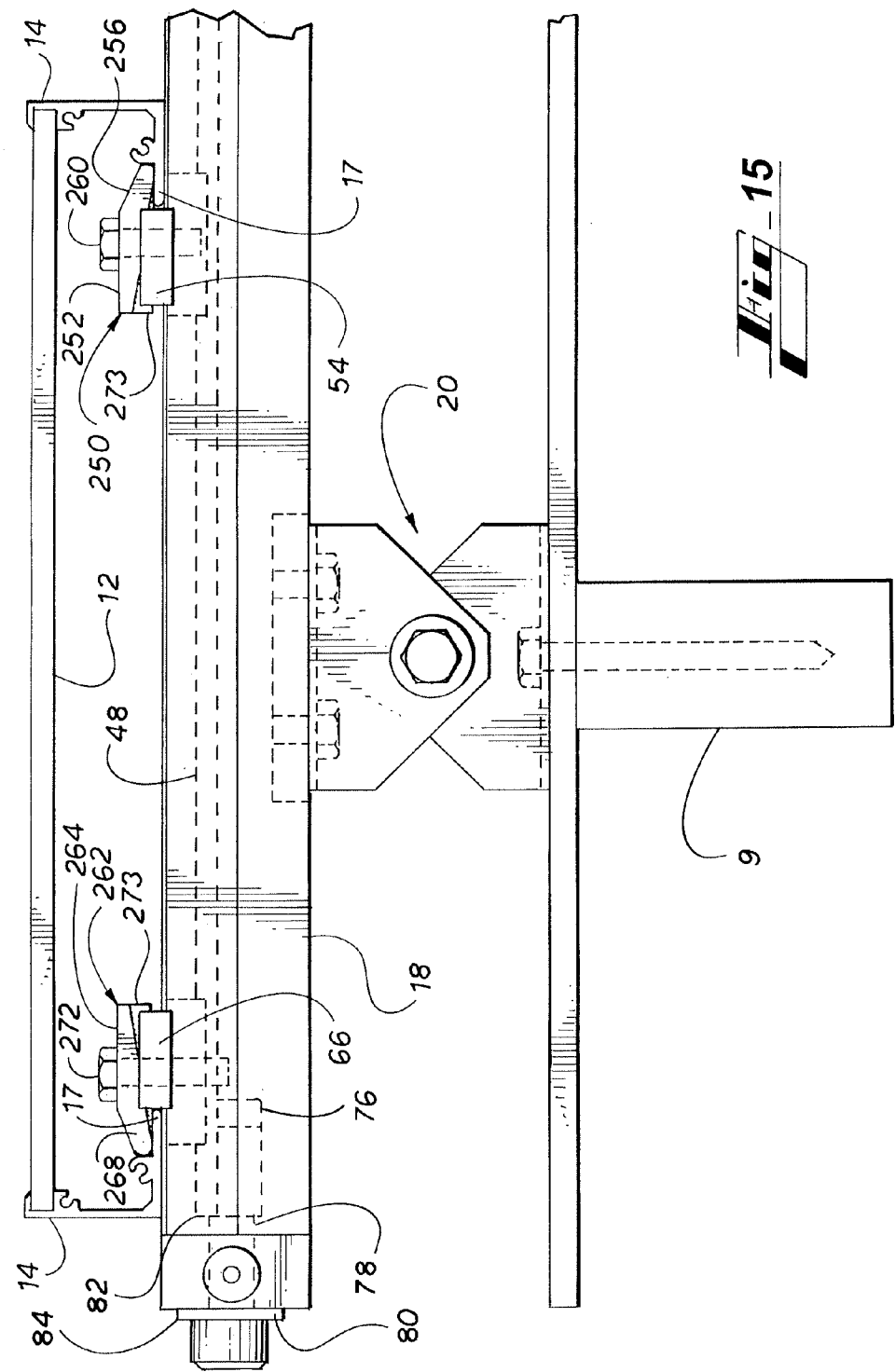

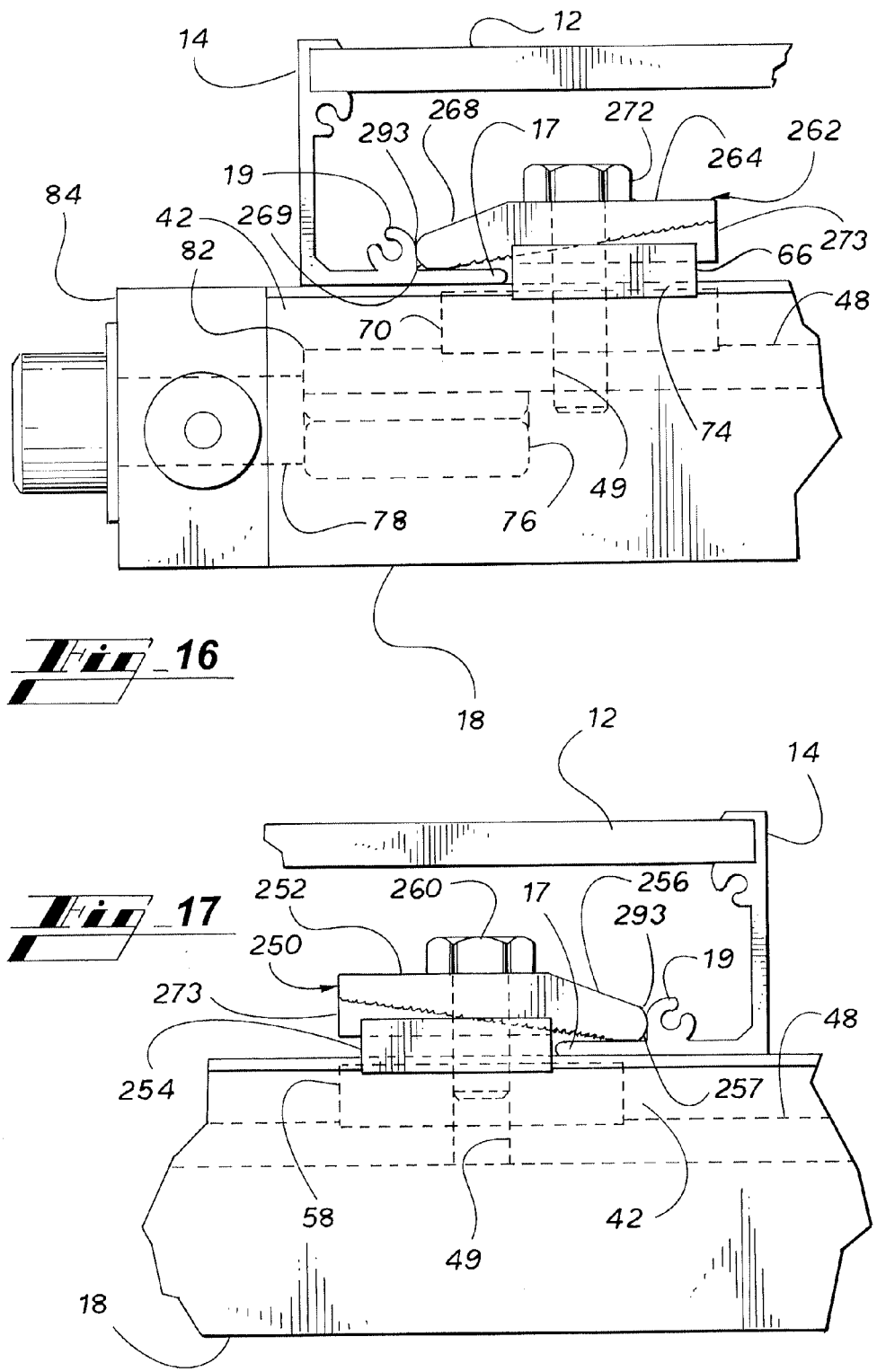

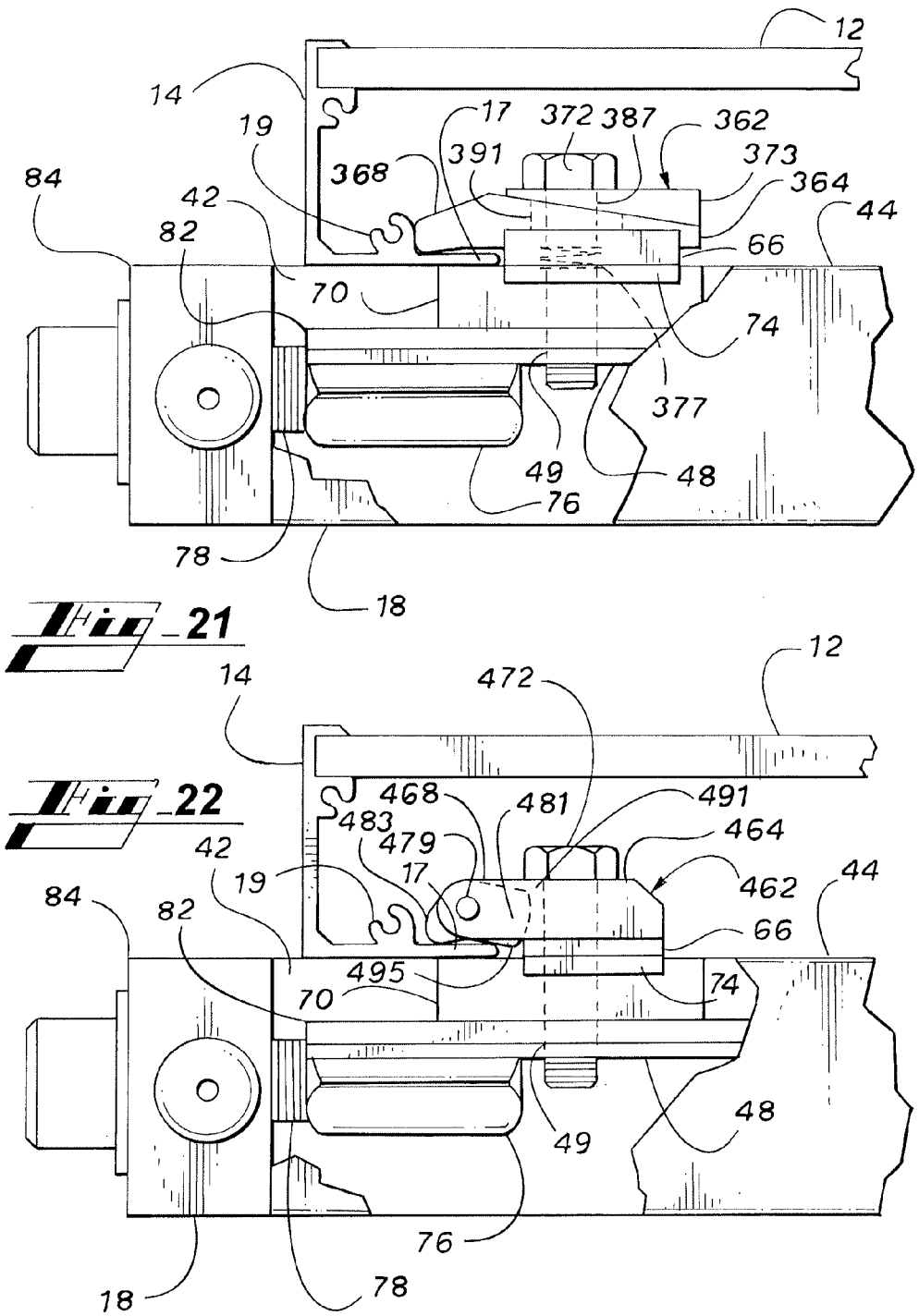

MOUNTING SYSTEM FOR PHOTOVOLTAIC PANELS

CROSS REFERENCE TO RELATED PATENT APPLICATIONS

This application is a continuation of U.S. patent application Ser. No. 13/448,918 filed Apr. 17, 2012, which is a continuation of Ser. No. 12/404,546, filed on Mar. 16, 2009 which claims priority to U.S. provisional application No. 61/037,092, filed Mar. 17, 2008, all of which are incorporated herein by reference.

FIELD OF THE INVENTION

This invention relates to a mounting system for flat panels, particularly photovoltaic panels, on a support structure or surface.

BACKGROUND OF THE INVENTION

Photovoltaic cells convert sunlight into electric current. In a practical application of such photovoltaic cells, the photovoltaic cells are incorporated into a panel comprising a number of photovoltaic cells. One or more such photovoltaic panels are then mounted on a support structure or surface that provides maximum exposure to sunlight. The support structure or surface may be a roof, a pole, a footing, the ground, or any other surface capable of supporting the photovoltaic panels.

In order to mount the photovoltaic panels (or other flat panels) on a support structure or surface, a mounting system is necessary. The mounting system must support the photovoltaic panels around their periphery and accommodate the existing support structure or surface, which may have irregularities.

SUMMARY OF THE INVENTION

A mounting system in accordance with the present invention provides peripheral support to the photovoltaic panels and accommodates unevenness or irregularities of the support structure or surface on which the photovoltaic panels (or other flat panels) are mounted. Moreover, the mounting system of the present invention provides for installation of photovoltaic panels where there is no access to the back of the photovoltaic panels. The mounting system of the present invention has a minimum part count based on the use of the same components for different installations.

The present invention provides numerous advantages in connection with mounting, attaching, and adjusting the configuration of one or more photovoltaic panels or other flat panels, and removing the one or more photovoltaic panels or other flat panels from a support structure or surface in a safe, reliable, yet rapid manner. At least one of the advantages of the present invention is that the mounting system and method allows installation both top down and bottom up using the same mounting system. The mounting system of the present invention also significantly reduces the number and variety of hardware parts and components needed to assemble the mounting system. In addition, the mounting system for removably and adjustably mounting the photovoltaic panels or other flat panels on the support structure or surface provides universal hardware, permitting installation of the photovoltaic panels or other flat panels on the support structure or surface in any direction or configuration. In addition, the present invention also accommodates photovoltaic panels of any size or shape on a variety of support structures or surfaces, while insuring that the photovoltaic panels remain securely attached to the support structure or surface.

Particularly, the mounting system of the present invention comprises photovoltaic panel frames, panel support rails, and mounting brackets or cross beams. The photovoltaic panels are mounted in the panel frames. The panel frames have inwardly extending panel frame extensions on their back side. The panel support rails are mounted on a support structure or surface with either pivoting brackets or cross beams. The support rails have pairs of stationary clamps with clamp lips and movable clamps with clamp lips that engage the panel frame extensions on the back side of the panel frames.

In order to mount the photovoltaic panels on a support structure or surface, each photovoltaic panel is mounted in a peripheral channel of the panel frame. The support rails are mounted on the support structure or surface either by use of the pivoting brackets or the cross beams. The framed photovoltaic panels are laid on the support rails and positioned so that the stationary clamp lip on the stationary clamp slides over and engages the panel frame extension along one side of the panel frame. The movable clamp is then pulled along the panel support rail by a lead screw so that the movable clamp lip on the movable clamp slides over and engages the panel frame extension on the opposite side of the panel frame. The framed photovoltaic panels are easily removed by turning the lead screw to slide the movable clamp and to disengage the movable clamp from the side of the panel frame. The framed photovoltaic panel is then slid along the panel support rail to disengage panel support frame from the clamp lip of the stationary clamp. The unique support rail of the present invention, in combination with the novel clamps of the present invention, also permit sliding adjustment and readjustment of the location of the photovoltaic panel on the support rail.

Further objects, features and advantages will become apparent upon consideration of the following detailed description of the invention when taken in conjunction with the drawings and the appended claims.

BRIEF DESCRIPTION OF THE DRAWINGS

FIG. 6 is a cross section view of the mounting system for photovoltaic panels in accordance with the present invention as seen along line 6-6 of FIG. 8.

FIG. 7 is a detailed side elevation view of the stationary clamp of the mounting system for photovoltaic panels in accordance with the present invention.

FIG. 8 is a detailed side elevation view of the movable clamp of the mounting system for photovoltaic panels in accordance with the present invention.

FIG. 10 is a side elevation view of another embodiment of the mounting system for photovoltaic panels in accordance with the present invention showing a panel support rail mounted on a cross beam.

FIG. 11 is an end elevation view of the embodiment of FIG. 10 of the mounting system for photovoltaic panels in accordance with the present invention showing a panel support rail mounted on a cross beam.

FIG. 12 is a side elevation view of another embodiment of the mounting system for photovoltaic panels in accordance with the present invention showing electrical connections between adjacent photovoltaic panels.

FIG. 13 is a perspective view of a modified movable clamp for the mounting system for photovoltaic panels in accordance with the present invention.

FIG. 14 is an end elevation view of the movable clamp of FIG. 13 for the mounting system for photovoltaic panels in accordance with the present invention.

FIG. 15 is a side elevation view of the mounting system for photovoltaic panels in accordance with the present invention incorporating the movable clamp of FIG. 13.

FIG. 16 is a detailed side elevation view of the mounting system for photovoltaic panels in accordance with the present invention incorporating the movable clamp of FIG. 13.

FIG. 17 is a detailed side elevation view of the mounting system for photovoltaic panels in accordance with the present invention incorporating a stationary clamp similar to the movable clamp of FIG. 13.

FIG. 18 is a detailed perspective view of a spacer wedge for the movable clamp of FIG. 13 and for the stationary clamp of FIG. 17 of the mounting system for photovoltaic panels in accordance with the present invention.

FIG. 19 is a detailed perspective view of a clamp body for both the movable clamp of FIG. 13 and for the stationary clamp of FIG. 17 of the mounting system for photovoltaic panels in accordance with the present invention.

FIG. 20 is an end elevation view of another embodiment a panel support rail of the mounting system for photovoltaic panels in accordance with the present invention.

FIG. 21 is a detailed side elevation view of another embodiment of a movable clamp for the mounting system for photovoltaic panels in accordance with the present invention.

FIG. 22 is a detailed side elevation view of another embodiment of a movable clamp for the mounting system for photovoltaic panels in accordance with the present invention.

DETAILED DESCRIPTION OF THE PREFERRED EMBODIMENT

Figure 1:
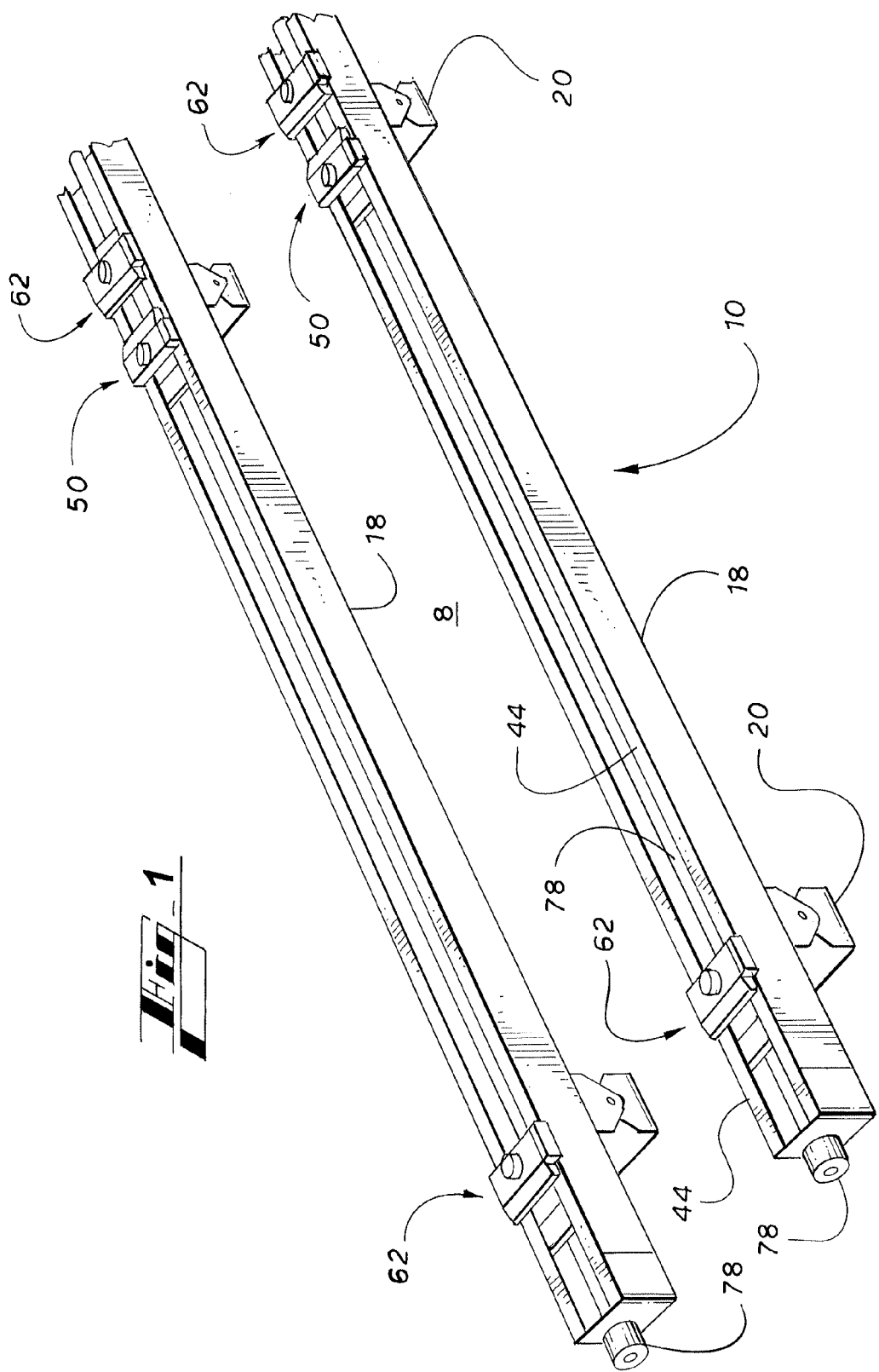
FIG. 1 is a perspective view of a mounting system for framed photovoltaic panels in accordance with the present invention with movable clamps in the engaged position.
Figure 2:
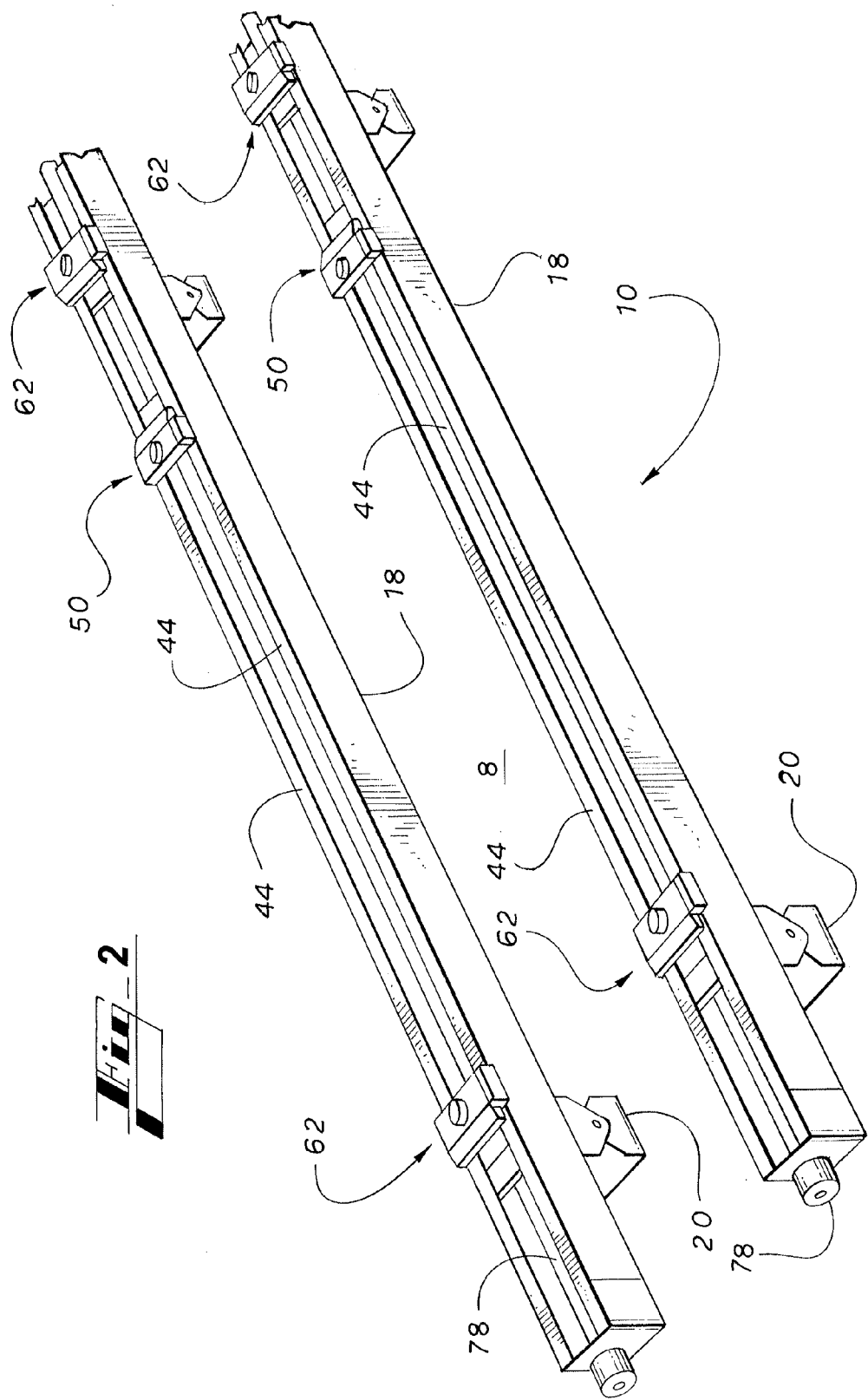
FIG. 2 is a perspective view of the mounting system for framed photovoltaic panels in accordance with the present invention with the movable clamps in the disengaged position.
Figure 3:
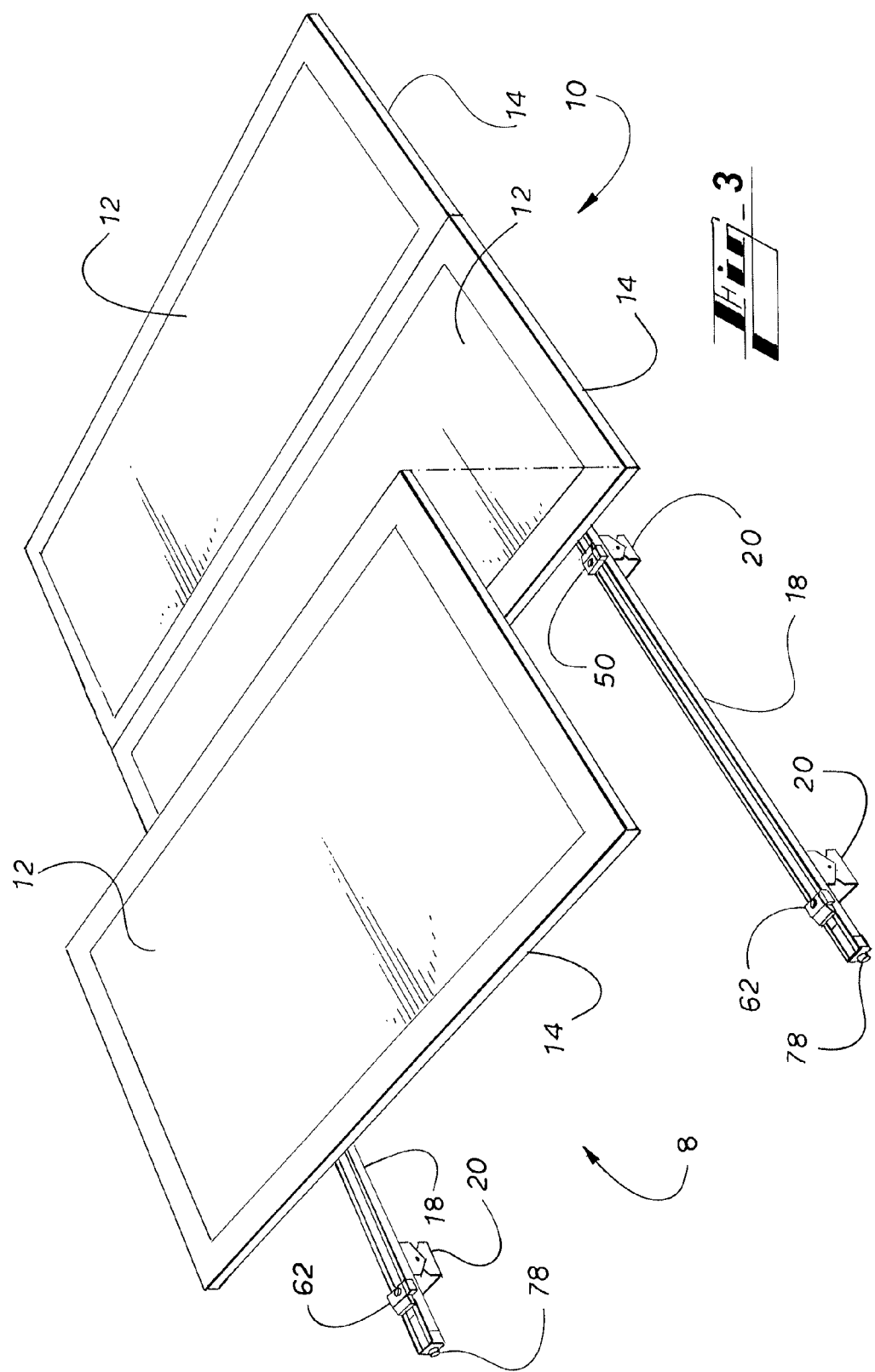
FIG. 3 is a perspective view of the mounting system for photovoltaic panels in accordance with the present invention with the movable clamps in the disengaged position.

FIGS. 1-3 show a mounting system 10 for mounting flat panels, such as photovoltaic panels 12 on a support structure or surface 8. As used in this application, the term "panels" is not limited to photovoltaic panels. For example, but not by way of limitation, the term "panels" includes any device capable of generating power, but may also be a device capable of holding liquids, gases or admixtures of solids. The support structure or surface 8 may include a roof or wall of a building, a pole, a footing, the ground, or any other surface capable of supporting the photovoltaic panels 12. The shape of the photovoltaic panel 12 may be rectangular, circular, or any other shape or configuration.

As shown in FIGS. 1-6, the mounting system 10 for the photovoltaic panels 12 comprises pivoting mounting brackets 20, panel support rails 18, and a panel frame 14. The pivoting mounting brackets 20 are mounted on the support structure or surface 8 and support the panel support rails 18. As shown in FIG. 3, the photovoltaic panels 12 are mounted within the panel frames 14, and the panel frames 14 are supported on the panel support rails 18 and held in place by means of stationary clamps 50 and movable clamps 62.

FIGS. 4-9 show the details of the construction of the panel mounting system 10 and how the panel mounting system 10 engages and holds the photovoltaic panels 12 in place on the support structure or surface 8. The construction of the panel frames 14 of the photovoltaic panels 12 is best seen in FIGS. 3, 4, 7, and 8. Particularly, each photovoltaic panel 12 is mounted in a panel frame 14. Each panel frame 14 is constructed from four panel frame members 15 that are fastened together to form the panel frame 14. Each of the frame members 15 has a panel support channel 16 extending adjacent its top edge and a panel frame extension 17 extending along its bottom edge and extending inwardly from the panel frame member 15 toward the center of the panel frame 14. The photovoltaic panel 12 is supported in the panel support channel 16 of the panel frame 14. As will be disclosed in greater detail, the panel frame extensions 17 of the panel frame 14 engage the stationary clamp 50 and movable clamp 62 of the panel support rail 18 to hold the photovoltaic panels 12 in place on the support structure 8.

Figure 4:
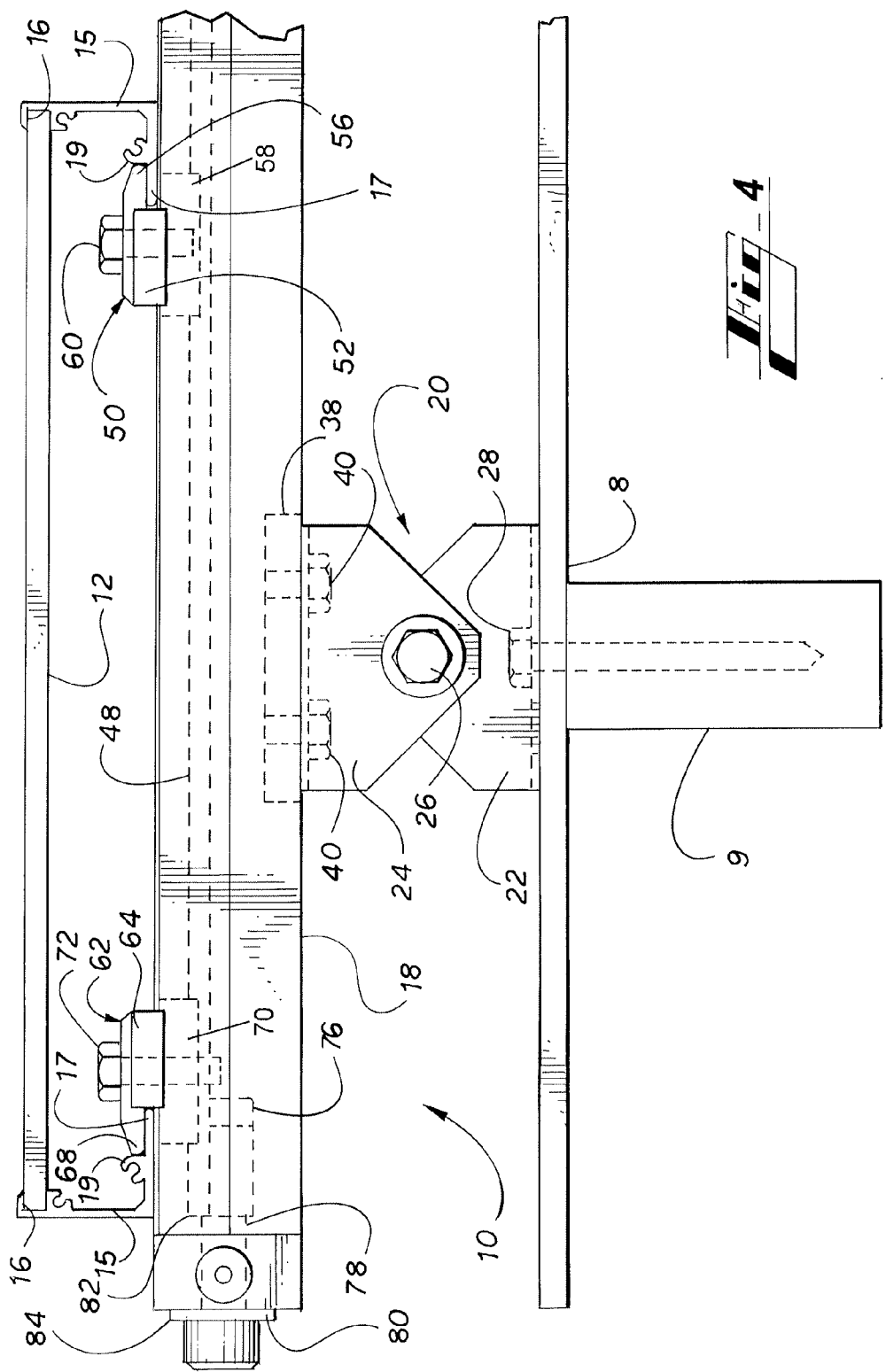
FIG. 4 is a side elevation view of the mounting system for photovoltaic panels in accordance with the present invention showing a panel support rail mounted on a pivoting bracket.
Figure 5:
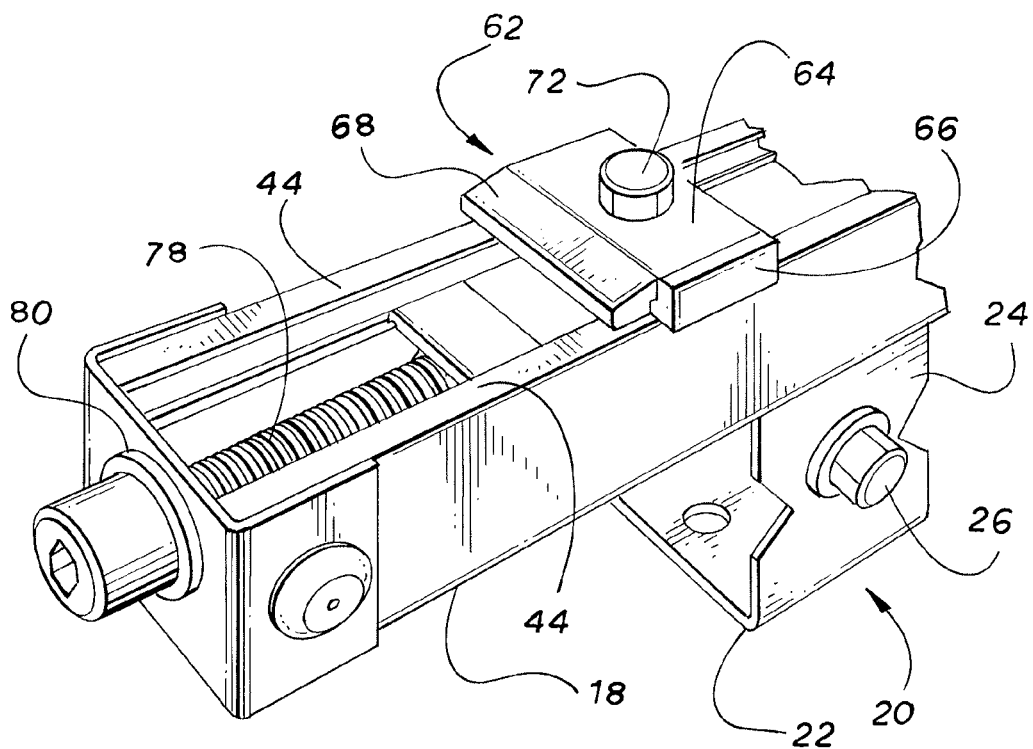
FIG. 5 is a detailed perspective view of the movable clamp of the mounting system for photovoltaic panels in accordance with the present invention.
Figure 9:
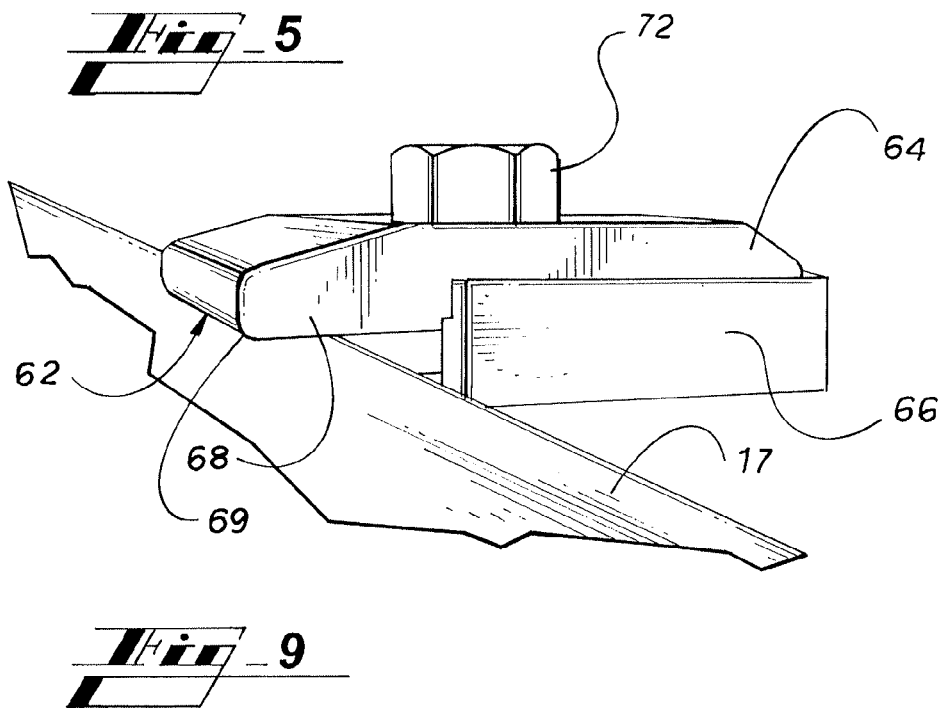
FIG. 9 is a detailed perspective view of the movable clamp of the mounting system for photovoltaic panels in accordance with the present invention.

Turning to FIGS. 4-6, the panel support rail 18 supports the photovoltaic panel 12 secured within the panel frame 14. In turn, the panel support rail 18 is supported on the support structure or surface 8 by the pivoting bracket 20. Each panel support rail 18 is an extrusion having a lower channel 32 and an upper channel 42 separated by a continuous web 34 (FIG. 6). The lower channel 32 has lower channel flanges 36, and the lower channel 32 connects the panel support rail 18 to the pivoting bracket 20. The upper channel 42 has upper channel flanges 44, and the upper channel 42 connects the stationary clamps 50 and the movable clamps 62 to the panel support rail 18.

The pivoting bracket 20 connects the panel support rail 18 to the support structure or surface 8. Each pivoting bracket 20 comprises a U-shaped lower member 22 and a U-shaped upper member 24 that are pivotally connected together by means of pivot bolt 26 as shown in FIGS. 4 and 6. The U-shaped lower member 22 is connected to the support structure 8 by any suitable fastener, which may include, by way of example, a lag bolt 28 shown in FIG. 4 or a machine bolt 28 shown in FIG. 6.

The connection of the pivoting bracket 20 to the panel support rail 18 is accomplished by means of lower channel flanges 36, a lower channel clinch nut 38, and a lower channel mounting bolt 40 (FIGS. 4 and 6). The lower channel mounting bolt 40 is inserted through a hole in the U-shaped upper member 24 to engage the clinch nut 38 disposed within the lower channel 32 of the panel support rail 18. The edge of the clinch nut 38 engages lower channel flanges 36 on either side of the lower channel 32 of the panel support rail 18. The lower channel mounting bolt 40 engages the clinch nut 38 and pulls the panel support rail 18 into frictional engagement with the U-shaped upper member 24 of the pivoting bracket 20. By loosening the lower channel mounting bolt 40, the panel support rail 18 is free to slide with respect to the pivoting bracket 20 to accommodate positioning of the pivoting bracket 20 on the support structure 8, such as to align the lag bolt 28 (FIG. 4) with the underlying structural member 9 of the support structure 8. In that way, the mounting system 10 is able to accommodate itself to support structures and surfaces 8 that have varying constructions and structural members 9. Once the pivoting bracket 20 is properly positioned with respect to the support structure 8 and the panel support rail 18, the lower channel mounting bolt 40 is tightened to lock the panel support rail 18 to the pivoting bracket 20.

As previously discussed, the upper channel 42 of the panel support rail 18 serves to connect the stationary clamp 50 and the movable clamp 62 to the panel support rail 18. Particularly, FIGS. 4, 6, and 8 show how the movable clamp 62 is connected to the panel support rail 18. The upper channel 42 comprises upper channel flanges 44 along the upper edge of the upper channel 42 and slide rail supports 46. A slide rail 48, extending along the length of the panel support rail 18, is supported for sliding movement on the slide rail supports 46. As shown in the FIGS. 4 and 8, the slide rail 48 has a threaded slide rail nut 76 connected to one end 82 of the slide rail 48. A lead screw 78 is journaled into one end 84 of the panel support rail 18 and engages the slide rail nut 76. By turning the lead screw 78 counterclockwise and clockwise, the slide rail 48 moves back and forth along the length of the panel support rail 18.

As best seen in FIGS. 6 and 8, the movable clamp 62 comprises a movable clamp body 64 and a movable clamp lip 68 with a lip cam surface 69. The movable clamp body 64 rests on an anti-twist clip 66 which in turn rests on the top surface of the panel support rail 18 and engages the sides of the panel support rail 18. A movable clamp bolt 72 extends through a hole in the movable clamp body 64 and engages a movable clamp clinch nut 70 within the upper channel 42. In addition, the movable clamp bolt 72 is long enough to engage a threaded hole 49 in the slide rail 48.

In order to move the movable clamp 62 along the length of the panel support rail 18, a spacer washer 74 is positioned between the movable clamp clinch nut 70 and the anti-twist clip 66. The spacer washer 74 keeps the movable clamp bolt 72 from pulling the movable clamp clinch nut 70 into frictional engagement with the upper channel flanges 44 of the upper channel 42 and from pulling the anti-twist clip 66 into frictional engagement with the upper surface of the panel support rail 18. Consequently, the movable clamp 62 cannot be locked onto the panel support rail 18 but instead is free to slide with the slide rail 48 as it slides back and forth along the slide rail supports 46 in response to rotation of the lead screw 78.

FIGS. 4 and 7 show how the stationary clamp 50 is connected to the panel support rail 18. The stationary clamp 50 comprises a stationary clamp body 52 and a stationary clamp lip 56 with a lip cam surface 57. The stationary clamp body 52 rests on an anti-twist clip 54, which in turn rests on the top surface of the panel support rail 18 and engages the sides of the panel support rail 18. A stationary clamp bolt 60 extends through a hole in the stationary clamp body 52 and engages a stationary clamp clinch nut 58 within the upper channel 42. The stationary clamp bolt 60, however, is not long enough to engage the threaded hole 49 in the slide rail 48. In order to lock the stationary clamp 50 at any position along the length of the panel support rail 18, the stationary clamp bolt 60 is tightened to draw the stationary clamp clinch nut 58 into frictional engagement with the upper channel flanges 44 on either side of the upper channel 42 and to draw the anti-twist clip 54 into frictional engagement with the upper surface of the panel support rail 18. Consequently, the stationary clamp 50 can be locked onto the panel support rail 18 at any desired location along the length of the panel support rail 18.

In order to mount the photovoltaic panels 12 on the support structure or surface 8, the photovoltaic panels 12 are first mounted in the panel support channel 16 of the panel frame 14. The panel support rails 18 are connected to the support structure or surface 8 by means of the pivoting brackets 20. For example, the pivoting brackets 20 are mounted to the support structure 8 at locations on the support structure 8 that that align with members 9 that provide sufficient support for the photovoltaic panels 12. With the pivoting brackets 20 mounted to the support structure or surface 8, the panel support rails 18 are positioned on the pivoting brackets 20 at positions that conform to the dimensions of the framed photovoltaic panels 12. With the pivoting brackets 20 properly positioned with respect to the panel support rails 18, the panel support rails 18 are locked in place on the pivoting brackets 20 by means of the lower channel clinch nut 38, the lower channel mounting bolt 40, and the lower channel flanges 36 (FIGS. 4 and 6). Further, the stationary clamps 50 are positioned and locked in place by tightening the stationary clamp bolt 60 so that the stationary clamp clinch nut 58 engages the upper channel flanges 44 along the upper edges of the upper channel 42.

With the panel support rails 18 mounted on the pivoting brackets 20 and the stationary clamps 50 positioned and locked in place on the panel support rails 18, the lead screw 78 on each of the panel support rails 18 is turned counterclockwise thereby moving the movable clamps 62 toward the stationary clamps 50 as shown in FIG. 2. As shown in FIG. 3, the photovoltaic panels 12 with the attached panel frames 14 are lowered onto the panel support rails 18 so that the movable clamp 62 and the stationary clamp 50 are positioned inside the panel frame extensions 17 of the panel frame 14. Once the panels are positioned on the panel support rails 18, each of the panels is manually moved to the left so that the panel frame extension 17 of the panel frame 14 engages lip cam surface 57 of the stationary clamp lip 56 of the stationary clamp 50. As the panel frame extension 17 of the panel frame 14 moves to the left, the lip cam surface 57 forces the panel frame extension 17 under the stationary clamp lip 56 and against the top of the panel support rail 18. Once the panel frame extension 17 of the panel frame 14 is secured under the stationary clamp lip 56 of the stationary clamp 50, the lead screw 78 is rotated clockwise to pull the movable clamp 62 toward the left end of the panel support rail 18 and away from the stationary clamp 50. As the movable clamp 62 moves to the left, the lip cam surface 69 of the movable clamp lip 68 engages the panel frame extension 17 on the opposite side of the panel frame 14. As best seen in FIGS. 4, 7, and 8, the stationary clamp 50 and the movable clamp 62 have fully engaged the panel frame extensions 17 on either side of the panel frame 14.

An alternative mounting system 100 is shown in FIGS. 10 and 11. The alternative mounting system 100 is similar to the mounting system 10, and therefore, the reference numerals used with respect to mounting system 10 will be used for the same parts incorporated into mounting system 100. The difference between the mounting system 10 and the mounting system 100 is that each of the pivoting brackets 20 of the mounting system 10 has been replaced with a cross beam 30, and each of the panel support rails 18 has been replaced by a modified panel support rail 118. The cross beam 30 and the modified panel support rail 118 are identical in cross section (FIGS. 10 and 11), thus saving on inventory costs. The modified panel support rail 118 has an upper channel 142 and lower channel 132 which are demarcated by slide rail supports 146. The cross beam 30 has an upper channel 162 and lower channel 152 which are demarcated by unused slide rail supports 166.

With respect to the modified panel support rail 118 (FIG. 11), the slide rail supports 146 support the slide rail 48 in the same way as the slide rail supports 46 support the slide rail 48 in the panel support rail 18. Likewise, the movable clamps 62 and the stationary clamps 50 are connected to the modified panel support rail 118 in the same way that they are connected to the panel support rail 18.

The modified panel support rail 118 is connected to the top of the cross beam 30 by means of a pair of clamps 90 that engage the lower edges 172 of the modified panel support rail 118 and are secured to the cross beam 30 by bolts 94 and clinch nuts 92 within the upper channel 162 of the cross beam 30 (FIG. 11). The clinch nuts 92 engage the upper channel 162 of the cross beam 30 in the same way that the stationary clamps 50 engage the upper channel 42 of the panel support rail 18. The cross beam 30 is attached to the support structure 8 by means of lag bolt 170 (FIG. 10).

Turning to FIG. 12, two adjacent photovoltaic panels 12 are mounted in panel frames 14. The panel frames 14 have modified panel frame members 114 and 115 that are positioned to abut each other when the photovoltaic panels 12 are mounted, by means of the stationary clamps 50 and the movable clamps 62, on the panel support rail 18 or on the modified panel support rail 118, as shown in FIG. 12. The modified panel frame member 114 has a male electrical plug 116 mounted to the inside of the modified panel frame member 114. Likewise, the modified panel frame member 115 has a female electrical receptacle 117 mounted to the inside of the modified panel frame member 115. The male electrical plug 116 and the female electrical receptacle 117 are connected by wires (not shown) to the photovoltaic cells of the photovoltaic panels 12. As the adjacent photovoltaic panels 12 are pulled toward each other by the action of the movable clamps 62, the male electrical plug 116 and the female electrical receptacle 117 engage each other. As a result of the engagement between the male electrical plug 116 and the female electrical receptacle 117, the adjacent photovoltaic panels 12 are electrically connected together without the necessity of separate, external wiring harnesses between adjacent photovoltaic panels 12. A sealing groove 119 is provided on the outside of the modified frame member 115, and a matching sealing groove 120 is provided on the outside of the modified frame member 114. A round gasket 121 is captured within the sealing groove 120 when the adjacent photovoltaic panels 12 are brought together to inhibit the entry of moisture from above the photovoltaic panels 12 into the area occupied by the male electrical plug 116 and the female electrical receptacle 117.

FIGS. 13-19 show an alternative embodiment for a stationary clamp 250 (FIG. 17) and for a movable clamp 262 (FIG. 16) to be used with the panel support rail 18. The stationary clamp 250 and the movable clamp 262 are configured to accommodate varying thicknesses of the panel frame extensions 17 of the panel frame 14. With reference to FIGS. 13-17 and as previously described, the panel support rail 18 has the upper channel 42 with the upper channel flanges 44 along the upper edge of the upper channel 42 and the slide rail supports 46. The slide rail 48 extends along the length of the panel support rail 18 and is supported for sliding movement on the slide rail supports 46. As shown in the FIGS. 13-16, the slide rail 48 has a threaded slide rail nut 76 connected to one end 82 of the slide rail 48. The lead screw 78 is journaled into one end 84 of the panel support rail 18 and engages the slide rail nut 76. By turning the lead screw 78 counterclockwise and clockwise, the slide rail 48 moves back and forth on the slide rail supports 46 along the length of the panel support rail 18.

As best seen in FIGS. 13 and 16, the movable clamp 262 comprises a movable clamp body 264 (FIG. 19) and a spacer wedge 273 (FIG. 18). The movable clamp body 264 has a movable clamp lip 268 with a lip cam surface 269. The movable clamp body 264 rests on the spacer wedge 273, which in turn rests on the anti-twist clip 66, which in turn rests on the upper surface of the panel support rail 18 (FIGS. 13 and 14). A movable clamp bolt 272 extends through a hole in the movable clamp body 264 and through a hole in the spacer wedge 273 and engages the movable clamp clinch nut 70 located within the upper channel 42 of the panel support rail 18. In addition, the movable clamp bolt 272 is long enough to engage a threaded hole 49 in the slide rail 48 (FIG. 16) for movement as previously described.

FIG. 17 shows how the stationary clamp 250 is connected to the panel support rail 18. The stationary clamp 250 comprises a stationary clamp body 252 (FIG. 19) and the spacer wedge 273 (FIG. 18). The stationary clamp body 252 has a stationary clamp lip 256 with a lip cam surface 257. The stationary clamp body 252 rests on the spacer wedge 273, which in turn rests on the anti-twist clip 54, and which in turn rests on the upper channel flanges 44 of the panel support rail 18. A stationary clamp bolt 260 extends through the stationary clamp body 252 and the spacer wedge 273 and engages the stationary clamp clinch nut 58 within the upper channel 42 of the panel support rail 18 to lock the stationary clamp 2502 the panel support rail 18 as previously described.

With reference to FIG. 18, the spacer wedge 273 has an upper roughened surface 285, a lower smooth surface 286, and a mounting hole 287. With reference to FIG. 19, the clamp body 264 of the movable clamp 262 and the clamp body 252 of the stationary clamp 250 have a clamp lip 268 for the movable clamp 262 and a clamp lip 256 for the stationary clamp 250. Each of the clamp lips 268 and 256 have a roughened leading edge 293 and a roughened lower surface 288. The roughened surfaces, including upper roughened surface 285 of the spacer wedge 273 (FIG. 18), lower roughened surface 288 of the clamp body (264, 252) (FIG. 19), and the roughened leading edge 293 of the clamp lip (268, 256) (FIG. 19), may be longitudinal grooves as shown in the figures or those surfaces may be configured in any way to roughen those surfaces and thereby increase the friction of those surfaces. The clamp body (264, 252) has a hole 291 to accommodate respectively the movable clamp bolt 272 of the movable clamp 262 or the stationary clamp bolt 260 of the stationary clamp 250.

With reference to FIG. 16, the movable clamp 262 is able to accommodate varying thicknesses of the panel frame extension 17 of the panel frame 14 by positioning the spacer wedge 273 fore and aft with respect to the movable clamp body 264 and the anti-twist clip 66. The fore and aft positioning of the spacer wedge 273 is accomplished by drilling the wedge mounting hole 287 at different locations, fore and aft on the spacer wedge 273. Therefore, for each panel frame 14 having a particular thickness of the panel frame extension 17, the appropriate spacer wedge 273 with a properly positioned wedge mounting hole 287 is supplied. The wedge mounting hole 287 could also be a slot allowing fore and aft movement of the spacer wedge 273. The upper roughened surface 285 of the spacer wedge 273 engages the lower roughened surface 288 of the movable clamp body 264 to arrest any relative movement fore and aft between the spacer wedge 273 and the movable clamp body 264. Once the movable clamp bolt 272 is tightened, relative movement between the upper roughened surface 285 of the spacer wedge 273 and the lower roughened surface 288 of the movable clamp body 264 is arrested, and likewise relative movement between the spacer wedge 273 and the movable clamp body 264 is arrested. The stationary clamp 250 (FIG. 17) is similarly configured with the properly positioned spacer wedge 273 to accommodate varying thicknesses of the panel frame extension 17.

Turning to FIGS. 16 and 19, the roughened leading edge 293 of the movable clamp body 264 engages protrusion 19 of the panel frame 14. The engagement between the roughened leading edge 293 and the protrusion 19 of the panel frame 14 helps to inhibit any lateral shifting between the movable clamp body 264 and the panel frame 14. Similarly, as shown in FIGS. 17 and 19, the roughened leading edge 293 of the stationary clamp body 252 engages protrusion 19 of the panel frame 14. The engagement between the roughened leading edge 293 and the protrusion 19 of the panel frame 14 helps to inhibit any lateral shifting between the stationary clamp body 252 and the panel frame 14.

FIG. 21 shows another embodiment of a movable clamp 362 in accordance with the present invention. The stationary clamp (not shown) and the movable clamp 362 are similar in construction and are configured to accommodate varying thicknesses of the panel frame extensions 17 of the panel frame 14. The movable clamp 362 comprises a movable clamp body 364 and a spacer wedge 373. The movable clamp body 364 has a movable clamp lip 368. The spacer wedge 373 rests on the movable clamp body 364, which in turn rests on a compression spring 377, which in turn rests on the anti-twist clip 66, and which in turn rests on the upper surface of the panel support rail 18. A movable clamp bolt 372 extends through a spacer wedge hole 387 in the spacer wedge 373, extends through a slot 391 (extending fore and aft) in the movable clamp body 364, extends through the compression spring 377, and engages the movable clamp clinch nut 70 within the upper channel 42 of the panel support rail 18. As previously explained, the movable clamp bolt 372 is long enough to engage a threaded hole 49 in the slide rail 48 so that the movable clamp 362 slides along the length of the panel support rail 18 when the lead screw 78 is rotated.

With continuing reference to FIG. 21, the movable clamp 362 is able to accommodate varying thicknesses of the panel frame extension 17 of the panel frame 14 by relative fore and aft movement between the spacer wedge 373 and the movable clamp body 364. In order to engage and hold the panel frame extension 17, the movable clamp 362 is initially in a position to the right of the position shown in FIG. 21. The movable clamp body 364 with its movable clamp lip 368 is held in an elevated position by the compression spring 377 so that the clamp lip 368 can move over the panel frame extension 17 as the movable clamp 362 is drawn to the left by means of the lead screw 78. Once the movable clamp lip 368 passes over the panel frame extension 17 and engages the protrusion 19, the leftward movement of the movable clamp body 364 is arrested, and the action of the lead screw 78 pulls the spacer wedge 373 leftward while the movable clamp bolt 372 slides in the slot 391 of the movable clamp body 364. Continuing leftward movement of the spacer wedge 373 wedges the movable clamp body 364 downward against the force of compression spring 377 and into tight engagement with the clamp frame extension 17 and the anti-twist clip 66. The same configuration can be used for a stationary clamp.

FIG. 22 shows another embodiment of a movable clamp 462 accordance with the present invention. Again, the stationary clamp (not shown) and the movable clamp 262 are similar in construction and are configured to accommodate varying thicknesses of the panel frame extensions 17 of the panel frame 14. The movable clamp 462 comprises a movable clamp body 464 and a movable clamp lip 468 with a cam lock 481. The movable clamp body 464 rests on the anti-twist clip 66, which in turn rests on the upper surface of the panel support rail 18. A movable clamp bolt 472 extends through a hole 491 in the movable clamp body 464 and the anti-twist clip 76 and engages the movable clamp clinch nut 70 within the upper channel 42 of the panel support rail 18. In addition, the movable clamp bolt 472 is long enough to engage a threaded hole 49 in the slide rail 48 so that the movable clamp 462 slides along the length of the panel support rail 18 when the lead screw 78 is rotated.

With continuing a reference to FIG. 22, the movable clamp 462 is able to accommodate varying thicknesses of the panel frame extension 17 of the panel frame 14 by means of a cam lock 481 pivotally mounted to the movable clamp lip 468 to engage the frame panel frame extension 17. The cam lock 481 is mounted on a pivot pin 479 extending through the movable clamp lip 468. The cam lock 481 includes a forward extending nose portion 483 and a trailing tail portion 495. In order to engage and hold the panel frame extension 17 against the top surface of the panel support rail 18, the movable clamp 462 is initially in a position to the right of the position shown in FIG. 22. The movable clamp body 464 with its movable clamp lip 468 and pivoting cam lock 481 is positioned so that the nose portion 483 of the cam lock 481 can move over the panel frame extension 17 as the movable clamp 462 is drawn to the left by means of the lead screw 78. Once the nose portion 483 of the cam lock 481 passes over the panel frame extension 17 as the movable clamp 462 moves leftward, the panel frame extension 17 is forced under the tail portion 495 of the cam lock 481 causing the cam lock 481 to rotate counterclockwise. The counterclockwise rotation of the cam lock 481 forces the nose portion 483 of the cam lock 481 into tight engagement with the panel frame extension 17. The same configuration can be used for a stationary clamp.

Turning to FIG. 20, another embodiment of a panel support rail 318 is shown. The panel support rail 318 is generally H-shaped with vertical legs 300, upper cross web 346, and lower cross web 334. The vertical legs 300 comprise an outer member 310 and an inner member 312 with a space 314 between the members 310 and 312. The upper surface of the panel support rail 318 are roughened to engage anti-twist clips, such as anti-twist clips 66 and 54 as previously described. A slide rail 348 is supported by the upper web 346. The slide rail 348 is connected to a slide rail nut 376 and to a movable clamp in a fashion similar to the slide rail 48 previously described. The slide rail nut 376 is engaged by a lead screw (not shown) so that the slide rail 348 can slide along the length of the panel support rail 318 and thereby move the movable clamp.

While this invention has been described with reference to preferred embodiments thereof, it is to be understood that variations and modifications can be affected within the spirit and scope of the invention as described herein and as described in the appended claims.

The invention claimed is:

1. A system for mounting a flat panel on a support structure, the system comprising:
   a. a panel frame in which the flat panel is mounted, the panel frame having a front side and a back side and having an inwardly extending panel frame extension on the back side of the panel frame, wherein the panel frame extension extends inwardly toward the center of the panel frame and is offset from a plane including the flat panel;
   b. a panel support rail having a length and an upper most surface for supporting the panel frame and having a stationary clamp and a movable clamp that is movable along the length of the rail toward and away from the stationary clamp, and when the movable clamp moves away from the stationary clamp, movement of the movable clamp along the length of the rail away from the stationary clamp engages and secures the panel frame extension to the panel support rail, wherein the movable clamp is slidably supported on the upper surface of the panel support rail, and the movable clamp moves along the length of the panel support rail; and c. a mounting bracket for supporting the panel support rail on the support structure.

2. The system for mounting a flat panel on a support structure of claim 1, wherein the stationary clamp is supported on the upper surface of the panel support rail at a position along the length of the panel support rail and is fixed to the panel support rail by means of a stationary clamp bolt and clinch nut interconnecting the stationary clamp and the panel support rail, wherein the movable clamp is slidably supported on the upper surface of the panel support rail and moves along the length of the panel support rail, wherein the stationary clamp and the movable clamp each have a clamp body with an attached clamp lip, and wherein the clamp lip engages the frame extension of the frame panel to secure the flat panel to the panel support rail.

3. The system for mounting a flat panel on a support structure of claim 1, wherein the mounting bracket for supporting the panel support rail comprises an upper member connected to the panel support rail and a lower member connected to the support structure and wherein the upper member and the lower member are pivotally connected to each other.

4. The mounting system of claim 3, wherein the stationary clamp is supported on the upper surface of the panel support rail at a position along the length of the panel support rail and is fixed to the panel support rail by means of a bolt and clinch nut interconnecting the stationary clamp and the panel support rail.

5. The mounting system of claim 3, wherein the mounting bracket for supporting the panel support rail comprises an upper member connected to the panel support rail and a lower member connected to the support structure and wherein the upper member and the lower member are pivotally connected to each other.

* * * * *